United States Patent
Geiss et al.

(10) Patent No.: US 11,009,539 B2
(45) Date of Patent: May 18, 2021

(54) DEVICE AND METHOD FOR INSULATION MONITORING INCLUDING IDENTIFICATION OF A FAULTY OUTER CONDUCTOR IN A THREE-PHASE UNGROUNDED POWER SUPPLY SYSTEM

(71) Applicant: BENDER GMBH & CO. KG, Gruenberg (DE)

(72) Inventors: Manfred Geiss, Ulrichstein (DE); Carsten Weiss, Laubach (DE)

(73) Assignee: BENDER GMBH & CO. KG, Gruenberg (DE)

( * ) Notice: Subject to any disclaimer, the term of this patent is extended or adjusted under 35 U.S.C. 154(b) by 238 days.

(21) Appl. No.: 16/270,281

(22) Filed: Feb. 7, 2019

(65) Prior Publication Data

US 2019/0250204 A1    Aug. 15, 2019

(30) Foreign Application Priority Data

Feb. 9, 2018    (DE) .................... 10 2018 102 959.4

(51) Int. Cl.
*G01R 31/12*        (2020.01)
*G01R 31/14*        (2006.01)
(Continued)

(52) U.S. Cl.
CPC ........ *G01R 31/1272* (2013.01); *G01R 27/025* (2013.01); *G01R 31/52* (2020.01); *G01R 31/40* (2013.01); *G01R 31/58* (2020.01)

(58) Field of Classification Search
CPC .... G01R 31/02; G01R 31/12; G01R 31/1272; G01R 31/14; G01R 31/021; G01R 31/333; G01R 27/18; G01R 27/26; G01R 27/28

See application file for complete search history.

(56) References Cited

U.S. PATENT DOCUMENTS

2015/0255976 A1    9/2015 Hackl et al.
2016/0315461 A1*  10/2016 Pieler ...................... H02H 3/16

FOREIGN PATENT DOCUMENTS

CN    101915884 B    5/2012
DE    19837933 A1    3/2000
(Continued)

OTHER PUBLICATIONS

English Translation Abstract of CN101915884B dated May 3, 2012.
(Continued)

*Primary Examiner* — Neel D Shah
(74) *Attorney, Agent, or Firm* — King & Schickli, PLLC

(57) ABSTRACT

The invention relates to a device and a method for insulation monitoring including identification of a faulty outer conductor in a three-phase ungrounded power supply system.

The fundamental idea of the present invention rests upon determining the phase angle between the measured mains voltage and the measured neutral-point voltage when presuming only one measurement of the mains voltage to ground at one of the outer conductors and one measurement of the neutral-point voltage to ground. The value of the thus determined phase angle is in one of three angle ranges which each extend over 120 degrees and are to be assigned to one of the three outer conductors so that the faulty outer conductor is determined. The faulty outer conductor is thus detected by measuring only one mains voltage in conjunction with the measurement of the neutral-point voltage by evaluating the phase between the two measured voltage.

6 Claims, 1 Drawing Sheet

(51) Int. Cl.
*G01R 27/18* (2006.01)
*G01R 27/26* (2006.01)
*G01R 27/28* (2006.01)
*G01R 27/02* (2006.01)
*G01R 31/52* (2020.01)
G01R 31/58 (2020.01)
G01R 31/40 (2020.01)

(56) References Cited

FOREIGN PATENT DOCUMENTS

| | | |
|---|---|---|
| DE | 102014201044 B3 | 3/2015 |
| ES | 2319897 T3 | 5/2009 |
| WO | 2005038474 A1 | 4/2005 |
| WO | 2009121382 A1 | 10/2009 |

OTHER PUBLICATIONS

English Translation Abstract of ES2319897T3 dated May 14, 2009.
English Machine Translation of WO2009121382A1 dated Oct. 8, 2009.

\* cited by examiner

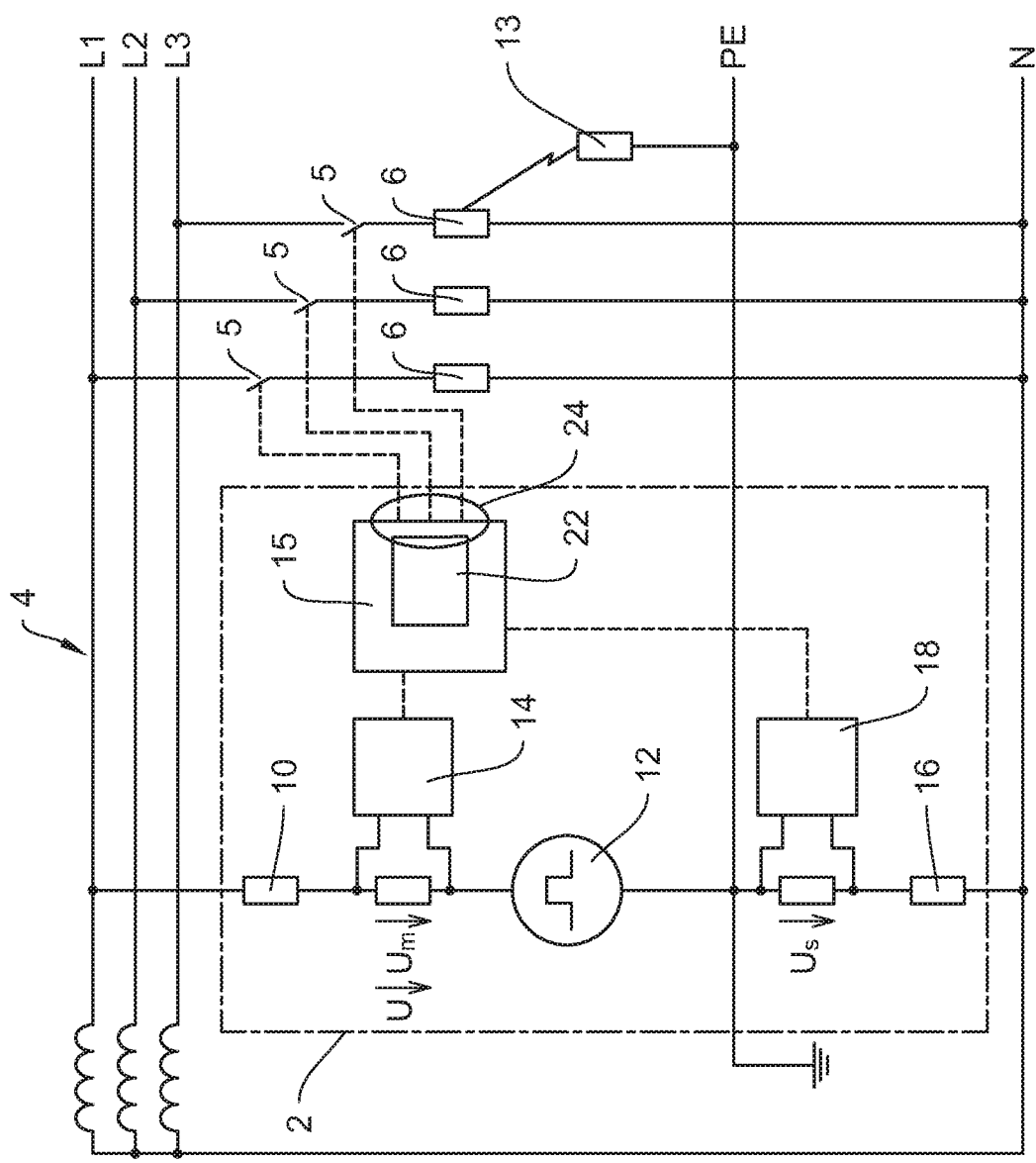

DEVICE AND METHOD FOR INSULATION MONITORING INCLUDING IDENTIFICATION OF A FAULTY OUTER CONDUCTOR IN A THREE-PHASE UNGROUNDED POWER SUPPLY SYSTEM

This application incorporates by reference the disclosure of German Patent Application No. 10 2018 102 959.4, filed Feb. 9, 2018.

TECHNICAL FIELD

The invention relates to a device and a method for insulation monitoring including an identification of a faulty outer conductor in a three-phase ungrounded power supply system, comprising a first coupling circuit for connecting one of the outer conductors, comprising a pulse generator for generating a measuring current, comprising a first measuring device for measuring a measuring-voltage drop effected by the measuring current, and comprising an evaluation device for determining an insulation resistance.

BACKGROUND

Electric installations having a high energy demand, such as a smelting or annealing furnace, other heating installations or deposition equipment from the chemical industry, often require special safety measures for limiting the effect of electric faults. This is founded in the necessity to prevent fires, explosions or chemical accidents. Additionally, the necessity of being able to continue operating electric installations over a certain period of time when an electric fault has arisen often exists in order to prevent a production stop or because a production process cannot be temporarily disrupted for operational or physical reasons.

Ideally, these objectives are attained by an ungrounded power supply system for supplying power, also referred to as an insulated power supply system or IT system for short (French: Isolé Terre—IT).

In this grid type, the secondary side of the inputting mains transformer or the current-generating generator does not have a direct connection to the ground potential, i.e. to ground. If a first insulation fault, such as a ground fault in a connected consumer or at an outer conductor itself, arises in the electric installation connected to the input location, a critical fault current does not flow yet and the installation can continue in operation in most instances—at least high-energy fault situations do not occur. Since a grounded grid has now been established by the first fault, a second insulation fault would have the same consequential effect as in a grounded power supply system (TN system, from French Terre Neutre). It is therefore imperative to identify the first fault and to remove it as quickly as possible, depending on the individual risk assessment of the installation, or to even immediately turn off the affected installation part if necessary.

For monitoring the insulation condition of the installation, installation monitoring devices are commonly used which comprise a pulse generator functioning as a measuring-voltage generator which superposes a measuring voltage on the grid. When an insulation fault arises, a measuring circuit is closed between a faulty outer conductor and ground, a measuring current proportional to the insulation fault flowing in said measuring circuit; said measuring current is detected as a measuring-voltage drop by means of a measuring device of the insulation monitoring device and is evaluated in an (insulation resistance) evaluation device of the insulation monitoring device so as to determine the insulation resistance.

Since high operating voltages are often used in electric installations requiring much energy for reducing the operating currents and thus also the cross sections of used conductors, insulation monitoring devices configured for these operating voltages are expensive or require sophisticated coupling devices.

Due to the measuring methods applied in the insulation monitoring devices, another disadvantage is that only one single (active) insulation monitoring device can be used for each IT system in order to keep the measuring processes from influencing each other. This insulation monitoring device then monitors the total insulation resistance of the installation.

To predictively plan maintenance activities, to implement repair works caused by insulation degradations or to selectively turn off installation parts—thus allowing a continued operation of the remaining installation—it is mandatory to be able to determine the location of the arisen insulation fault in the installation.

For this purpose an insulation fault location device is used according to the state of the art. This insulation fault location device comprises a test-current generator for generating a test current and a (test-current) evaluation device, which has measuring-current transformers connected thereto, in order to localize the faulty conductor outlet.

If a first insulation fault has been identified in the ungrounded power supply system by the insulation monitoring device, the insulation fault location is commenced by the test-current generator generating a test current which is supplied at a central location into the ungrounded power supply system between one or several active conductors and ground. A closed circuit is formed in which the test current flows from the test-current generator via the live active conductor(s), via the insulation fault and via a ground connection back to the test-current generator.

The fault location is localized by detecting the test current via the measuring-current transformers, which are each firmly assigned to a conductor section to be monitored.

The test current is detected as a residual current by all measuring-current transformers, which are in the test circuit (fault circuit), is evaluated in the evaluation device and displayed by the insulation fault location device. The fault location can be localized by the known assignment of the measuring-current transformer to the conductor branches.

In the previously described use of high mains voltages in power supply systems supplying consumers with a high energy demand, however, suitable test-current generators can only be obtained with much difficulty on the market or indeed it is difficult to construct a test-current generator configured for such high operating voltages as corresponding components resistant to voltage are highly priced.

Furthermore, the insulation strength of the components of the insulation fault location device, in particular of the measuring-current transformers, often poses a problem which can oppose an insulation fault location. Retrofitting existing installations can also be difficult since the installation space for corresponding so-called "split" current transformers which can be retrospectively installed often is not available. Using band transformers oftentimes is also not desired due to the limited precision and sensitivity. In addition, conventional insulation fault location systems work rather slowly. More than 10 seconds can pass until a fault is localized, a duration not nearly sufficient for the requirements for the abovementioned applications.

In particular in three-phase IT systems in which independently of each other only one of the other outer conductors of independent single-phase consumers having a high energy demand is connected to each phase, that is to each outer conductor, it is desired to selectively identify only the faulty outer conductor of the three-phase IT system affected by the fault in the fault instance and to disconnect it from the grid if required but to continue supplying the remaining consumers via the unaffected outer conductors.

Presently, it is presumed that the consumers connected to the respective phase can be modelled having mostly identical values with respect to their equivalent circuit diagram. A purely capacitive load is not admissible at an outer conductor and a purely inductive load is not admissible at another outer conductor in the scope of the invention since this constellation would strongly influence the phase angle.

SUMMARY

The objective of the present invention is therefore to construct a device and to present a method which enables insulation monitoring and quickly identifying a faulty outer conductor in a three-phase ungrounded power supply system to whose outer conductors similar consumers are each connected.

This objective is attained with respect to a device by the first measuring device being configured for measuring a mains voltage between the connected outer conductor and ground and by a second coupling circuit for connecting a neutral point and by a second measuring device for measuring a neutral-point voltage between the neutral point and ground and by the evaluation device being configured for evaluating a phase between the mains voltage and the neutral-point voltage so as to detect a faulty outer conductor.

The fundamental idea is founded on determining the phase angle between the measured mains voltage and the measured neutral-point voltage on the presumption of only one measurement of the mains voltage to ground being implemented at one of the outer conductors and one measurement of the neutral-point voltage to ground being implemented. The value of the thus determined phase angle is in one of three angle ranges which are each to be assigned to one of the three outer conductors so that the faulty outer conductor is determined. The angle ranges each extend over 120 degrees, for example, in the instance of purely ohmic consumers and nearly identical leakage capacitances of the outer conductors so that no areas remain unassigned.

The angle ranges assigned to each individual outer conductor can generic) ally be adjusted specific to each application. On the one hand, this enables an adjustment to individual phase angles of the consumers and, on the other hand, the definition of areas which are not to be assigned to an individual outer conductor (an individual phase; e.g. when an insulation fault arises at two outer conductors). In the latter instance, this leads to the entire installation being turned off because assigning the faulty outer conductor is not possible.

The faulty outer conductor thus is detected by measuring only one mains voltage in conjunction with measuring the neutral-point voltage by evaluating the phase between the two measured voltages.

As an extension of the measurement of the measuring-current voltage drop effected by the measuring current as known from the state of the art, the first measuring device is configured such according to the invention that the mains voltage between the outer conductor and ground can be measured using said measuring device.

Via a second coupling circuit, the neutral-point voltage is measured between the neutral-point voltage and ground according to the invention in conjunction with a second measuring device.

The evaluation device is configured such that besides the insulation resistance being determined, the phase between the mains voltage measured by the first measuring device and the neutral-point voltage measured by the second measuring device is also determined. The thus detected phase provides information on which of the outer conductors in the three-phase ungrounded power supply system is faulty.

The two-sided coupling according to the invention with the first and the second coupling circuit enables identifying the faulty outer conductor in conjunction with the evaluation of the phase of the measured mains voltage and the measured neutral-point voltage. The device equipped in this manner according to the invention can be perceived as an enhanced insulation monitoring device which provides the possibility of identifying a faulty outer conductor beyond monitoring the insulation resistance.

In a further embodiment, the evaluation device comprises a decider for assigning the detected phase to an outer conductor.

The decider implements an assignment of the detected phase to one of the three outer conductors by examining in which of the three angle ranges the detected phase is, said angle ranges being of equal size and each being assigned to one of the outer conductors.

Furthermore, the device according to the invention comprises a control output for controlling a disconnect device for at least one of outer conductor.

In order to be able to disconnect the consumer connected to the outer conductor from the power supply grid after identifying this faulty outer conductor, a control output is provided for controlling the disconnect device. The control output conducts a control signal according to the assignment result obtained in the evaluation device.

The objective of the invention is attained in relation to a method by measuring a mains voltage between the connected outer conductor and ground by means of the first measuring device; by connecting a neutral point to a second coupling circuit; by measuring a neutral-point voltage between the neutral point and ground by means of a second measuring device; and by evaluating a phase between the mains voltage and the neutral-point voltage by means of the evaluation device.

According to the invention, the mains voltage is measured between the outer conductor and ground by means of the first measuring device. Furthermore, the neutral point of the three-phase ungrounded power supply system is connected via the second coupling circuit in order to be able to additionally measure the neutral-point voltage between the neutral point and ground by means of the second measuring device. In the evaluation device, the phase is evaluated between the mains voltage and the neutral-point voltage beyond determining the insulation resistance. The phase is evaluated by deciding in which of the phase angles which are each assigned to an outer conductor the detected value of the phase is.

Thus, the faulty outer conductor in the three-phase ungrounded power supply system can be directly deduced from the phase.

In a further embodiment of the method, the phase is evaluated between the mains voltage and the neutral-point voltage by measuring a period duration of the mains voltage; by detecting a phase-shift time between the mains voltage and the neutral-point voltage; and by converting the phase-shift time to the phase including assigning the faulty outer conductor.

First, the period duration of the mains voltage is detected. This can be attained by detecting the zero-crossing of the mains-voltage progression and by determining the distance of the zero-crossings. A phase-shift time between the mains voltage and the neutral-point voltage is detected in conjunction with the measurement of the neutral-point voltage. Subsequently, this phase-shift time is converted to the phase under consideration of the period duration. In this example, the assignment of the phase to the faulty outer conductor is yielded for purely ohmic consumers and nearly equal leakage capacities of the outer conductors as follows: outer conductor L1 is faulty if the phase angle is larger than 300 degrees and less than/equal to 60 degrees; outer conductor L2 is faulty if the phase angle is larger than 60 degrees and less than/equal to 180 degrees; and outer conductor L3 is faulty if the phase angle is larger than 180 degrees and less than/equal to 300 degrees.

Furthermore, a control signal for disconnecting the faulty outer conductor is generated.

If a faulty outer conductor is identified, a disconnect device in the power supply system is controlled via a control output and disconnects the outer conductor identified as faulty according to the assignment of the phase to the outer conductor and thus disconnects the load from the power supply system.

BRIEF DESCRIPTION OF THE DRAWING FIGURE

Further advantageous features of embodiments are derived from the following description and the drawing which describes a preferred embodiment of the invention by means of an example. In the following, The sole FIGURE illustrates a device according to the invention for insulation monitoring including identification of a faulty outer conductor in a three-phase ungrounded power supply system.

DETAILED DESCRIPTION

In the FIGURE, a device 2 according to the invention is illustrated in a three-phase ungrounded power supply system 4, said three-phase ungrounded power supply system comprising the outer conductors L1, L2, L3 to each of which a consumer 6 is connected. An insulation fault 13 in the form of a ground fault is present at the consumer 6 connected to the outer conductor L3.

The ungrounded power supply system 4 is provided with a disconnect device 5 which can turn off all of the outer conductors L1, L2, L3 separately.

The device 2 according to the invention comprises a first coupling circuit 10 for connecting the outer conductor L1, a pulse generator 12 for generating a measuring current, a first measuring device 14 for measuring a measuring-voltage drop Um effected by the measuring current and an evaluation device 15 for determining an insulation resistance.

The first coupling circuit 10 can be configured so as to have a high impedance so that preferably high powers having high thermal development do not have to be dissipated. Moreover, it is possible to reduce the voltage resistance by using a common voltage transformer or by using a possibly available low-voltage tap of the IT system transformer.

Besides the measuring-voltage drop Um effected by the measuring current, the first measuring device 14 also records the mains voltage U between the outer conductor L1 and ground PE via the first coupling circuit 10.

The first measuring device 14 therefore comprises circuit components, such as operational-amplifier circuits, which are suitable for processing nominal voltages of the ungrounded power supply system.

Furthermore, the device 2 according to the invention comprises a second coupling circuit 16 for connecting a neutral point N—or a neutral conductor connected to the neutral point N—and a second measuring device 18 for measuring a neutral-point voltage Us between the neutral point N and ground PE.

High powers also do not have to be dissipated via the second coupling circuit 16 to the neutral point N or the neutral conductor during normal operation as the neutral point N is near ground potential when fault-free. In the fault instance, however, the power dissipation of the second coupling circuit 16 can also be perceived as minimal if the measure of immediately turning off the outer conductor L3 having fault 13 is implemented.

Besides determining the insulation resistance, the phase is evaluated between the mains voltage U and the neutral point Us in the evaluation device 15 in order to determine the faulty outer conductor L3 via the assignment of the value of the phase to the outer conductors L1, L2, L3.

The value of the phase is assigned to the outer conductors L1, L2, L3 in an decider 22 of the evaluation device 15; the disconnect device 5 is signaled via a control output 24 of the evaluation device 15.

The user of the enhanced insulation monitoring device according to the invention yields the advantage of a continued operation of the consumers (production devices) being possible at the outer conductors (phases), L1 and L2 in this instance, not affected by the insulation fault and consequently a production stop remaining limited to the turned-off faulty production installation.

The invention claimed is:

1. A device for insulation monitoring (2) including identification of a faulty outer conductor (L1, L2, L3) in a three-phase ungrounded power supply system (4), comprising a first coupling circuit (10) for connecting one of the outer conductors (L1, L2, L3), comprising a pulse generator (12) for generating a measuring current, comprising a first measuring device (14) for measuring a measuring-voltage drop (Um) effected by the measuring current, and comprising an evaluation device (15) for determining an insulation resistance (Rf) of the three-phase ungrounded power supply system (4), characterized in that the first measuring device (14) is configured for measuring a mains voltage (U) between the connected outer conductor (L1, L2, L3) and ground (PE) and characterized by a second coupling circuit (16) for connecting a neutral point (N) and by a second measuring device (18) for measuring a neutral-point voltage (Us) between the neutral point (N) and ground (PE) and characterized in that the evaluation device (15) is configured for evaluating a phase between the mains voltage (U) and the neutral-point voltage (Us) for detecting a faulty outer conductor (L1, L2, L3).

2. The device according to claim 1, characterized in that the evaluation device (15) comprises a decider (22) for assigning the determined phase to an outer conductor (L1, L2, L3).

3. The device according to claim 1, characterized by a control output (24) for controlling a disconnect device for at least one outer conductor (L1, L2, L3).

4. A method for insulation monitoring including identification of a faulty outer conductor (L1, L2, L3) in a three-phase ungrounded power supply system (4), having the method steps:
- connecting an outer conductor (L1, L2, L3) to a first coupling circuit (10),
- generating a measuring current by means of a pulse generator (12),
- measuring a measuring voltage, which is effected by the measuring current, by means of a first measuring device (14),
- determining an insulation resistance of the three-phase ungrounded power supply system (4) by means of an evaluation device (15), characterized by:
- measuring a mains voltage (U) between the connected outer conductor (L1, L2, L3) and ground (PE) by means of the first measuring device (14),
- connecting a neutral point (N) to a second coupling circuit (16),
- measuring a neutral-point voltage (Us) between the neutral point (N) and ground (PE) by means of a second measuring device (18), and
- evaluating a phase between the mains voltage (U) and the neutral point voltage (Us) by means of the evaluation device (15).

5. The method according to claim 4, characterized in that the phase between the mains voltage (U) and the neutral-point voltage (Us) is evaluated by measuring a period duration of the mains voltage (U), by determining a phase shift time between the mains voltage (U) and the neutral-point voltage (Us) and by converting the phase shift time to the phase including assigning the faulty outer conductor (L1, L2, L3).

6. The method according to claim 4, characterized in that a control signal for disconnecting the faulty outer conductor (L1, L2, L3) is generated.

* * * * *

UNITED STATES PATENT AND TRADEMARK OFFICE
CERTIFICATE OF CORRECTION

PATENT NO. : 11,009,539 B2  
APPLICATION NO. : 16/270281  
DATED : May 18, 2021  
INVENTOR(S) : Geiss et al.

Page 1 of 1

It is certified that error appears in the above-identified patent and that said Letters Patent is hereby corrected as shown below:

In the Specification

Column 3, Line 49 – please replace "generic) ally" with ---generally---

Signed and Sealed this  
Seventh Day of September, 2021

Drew Hirshfeld  
*Performing the Functions and Duties of the*  
*Under Secretary of Commerce for Intellectual Property and*  
*Director of the United States Patent and Trademark Office*